United States Patent
Lewis et al.

(10) Patent No.: US 7,153,163 B2
(45) Date of Patent: Dec. 26, 2006

(54) MODULAR JACK FOR ETHERNET APPLICATIONS

(75) Inventors: Daniel R. Lewis, Incline Village, NV (US); Teddy Xiong, Huangshi (CN); Kenneth Koon Keung Lai, Hung Hom (HK)

(73) Assignee: Tyco Electronics Corporation, Middletown, PA (US)

( * ) Notice: Subject to any disclaimer, the term of this patent is extended or adjusted under 35 U.S.C. 154(b) by 523 days.

(21) Appl. No.: 10/196,452

(22) Filed: Jul. 16, 2002

(65) Prior Publication Data

US 2004/0012933 A1    Jan. 22, 2004

(51) Int. Cl.
*H01R 13/66*    (2006.01)
(52) U.S. Cl. ..................................... 439/620
(58) Field of Classification Search ................ 439/620
See application file for complete search history.

(56) References Cited

U.S. PATENT DOCUMENTS

| | | | |
|---|---|---|---|
| 4,906,208 A * | 3/1990 | Nakamura et al. .......... 439/607 |
| 5,069,641 A * | 12/1991 | Sakamoto et al. .......... 439/620 |
| 5,226,220 A * | 7/1993 | Gevas et al. ................ 29/605 |
| 5,282,759 A * | 2/1994 | Sakamoto et al. .......... 439/620 |
| 5,353,189 A * | 10/1994 | Tomlinson ................... 361/118 |
| 5,457,600 A * | 10/1995 | Campbell et al. ........... 361/643 |
| 5,587,884 A * | 12/1996 | Raman ........................ 361/728 |
| 5,647,767 A * | 7/1997 | Scheer et al. ............... 439/620 |
| 5,687,233 A * | 11/1997 | Loudermilk et al. ........ 379/442 |
| 5,759,067 A * | 6/1998 | Scheer ........................ 439/607 |
| 5,809,328 A | 9/1998 | Nogales et al. ............. 395/825 |
| 6,102,741 A * | 8/2000 | Boutros et al. ............. 439/620 |
| 6,222,848 B1 | 4/2001 | Hayward et al. ........... 370/412 |
| 6,554,638 B1 * | 4/2003 | Hess et al. .................. 439/490 |

* cited by examiner

*Primary Examiner*—Neil Abrams

(57) ABSTRACT

A magnetically coupled RJ-45 modular jack assembly for Ethernet applications including a coil pack comprised of a plurality of magnetic circuits. Various numbers of the magnetic circuits may be coupled together in series by way of a variety of wires which may then be soldered directly to a printed circuit board. In order to increase the robustness of the magnetic circuit connection, each group of magnetic circuits coupled together in series, may be encapsulated in an encapsulation material. Additionally, during encapsulation, numerous of the groups of magnet circuits may be encapsulated allowing a plurality of magnetic series to be grouped together further increasing the robustness of the magnetic circuits. Encapsulated coil sets (196, 198) may be fitted together (FIG. 10) and located in notch (190) in the printed circuit board.

15 Claims, 15 Drawing Sheets

MODULAR JACK FOR ETHERNET APPLICATIONS

BACKGROUND OF THE INVENTION

The present invention relates to a magnetic Ethernet connector employing magnetic circuitry encapsulated within a protective material. The encapsulated magnetic circuitry is attached to a printed circuit board within the Ethernet connector facilitating the connection.

Ethernet connectors, especially of the magnetic variety, are well known in the art. Although connectors of this type were originally intended for use in telecommunications, they have found wide acceptance in a variety of applications. For example, modular jacks are now commercially available as input/output interface connectors for networking applications, i.e. as an Ethernet connector.

When employed as Ethernet connectors, modular jacks generally receive an input signal from one electrical device and then communicate a cleaned up corresponding output signal to a second device coupled thereto. Magnetic circuitry is utilized in the transfer of the input signal of one device to the output signal of the second device and employed as a means of cleaning the input signal during transfer from the first device to the second.

Often, in regards to the mounting of components to the circuit board, direct surface mounting is often preferred, as this eliminates one step of the assembly process. However, this surface mounting places a premium on the limited real estate present on the surface of the circuit board.

SUMMARY OF THE INVENTION

It is an object of the invention to provide a gigabit Ethernet connector employing magnetic inductance means soldered to a printed circuit board. It is a further object of the invention to provide for a printed circuit board allowing for utilization of the magnetic inductance means. In addition, it is desirable to further provide magnetic inductance means having a structure allowing handling of the fragile component with reduced fear of damage.

These and other objects of the invention are achieved by providing an Ethernet connection jack including a printed circuit board having a notch located between the input connectors and the output connectors. The printed circuit board further includes a circuit trace allowing electrical current to travel from the input connectors to the output connectors. Soldered to the circuit board and affecting the current traveling through the printed circuit are a plurality of resistors, a plurality of capacitors, and a decoupling capacitor. Further, a plurality of core sets comprising magnetic circuitry are also soldered into the circuit. The presence of the notch in the circuit board allows the core sets to be located on either side of the circuit board, even through all soldering connections are present on only the underside of the circuit board.

The core sets are also encapsulated in an encapsulation material. The encapsulation material retains the magnetic circuitry in a set position relative to the other magnetic circuitry present within the core set. Further, two core sets may be encapsulated together, allowing the a first core set to be maintained in a set position relative to a second core set.

The printed circuit board is then incorporated into an Ethernet connector having housing, a subassembly, a plurality of input connectors for receiving a signal and a plurality of output connectors for outputting a signal. A terminal assembly is also included within the Ethernet connector allowing a signal transfer between a standard Ethernet input device and the inputs of the printed circuit board incorporated in the present invention.

Further scope of the applicability of the present invention will become apparent from the detailed description contained herein. However, it should be understood that the detailed description and specific example, while indicating one embodiment of the invention, are given by way of illustration only, since various changes and modifications within the spirit and scope of the invention will become apparent to those skilled in the art, from this detailed description.

BRIEF DESCRIPTION OF THE DRAWINGS

These and other features of the invention will become more apparent and the present invention will be better understood upon consideration of the following description and the accompanying drawings wherein.

DETAILED DESCRIPTION OF THE EMBODIMENTS OF THE INVENTION

The embodiment of the invention described herein is not intended to be exhaustive, nor to limit the invention to the precise forms disclosed. Rather, the embodiment selected for description has been chosen to enable one skilled in the art to practice the invention. This application also incorporates by reference two co-pending applications filed on even date, now U.S. Pat. No. 6,736,680 and 6,783,398.

Figure 1:
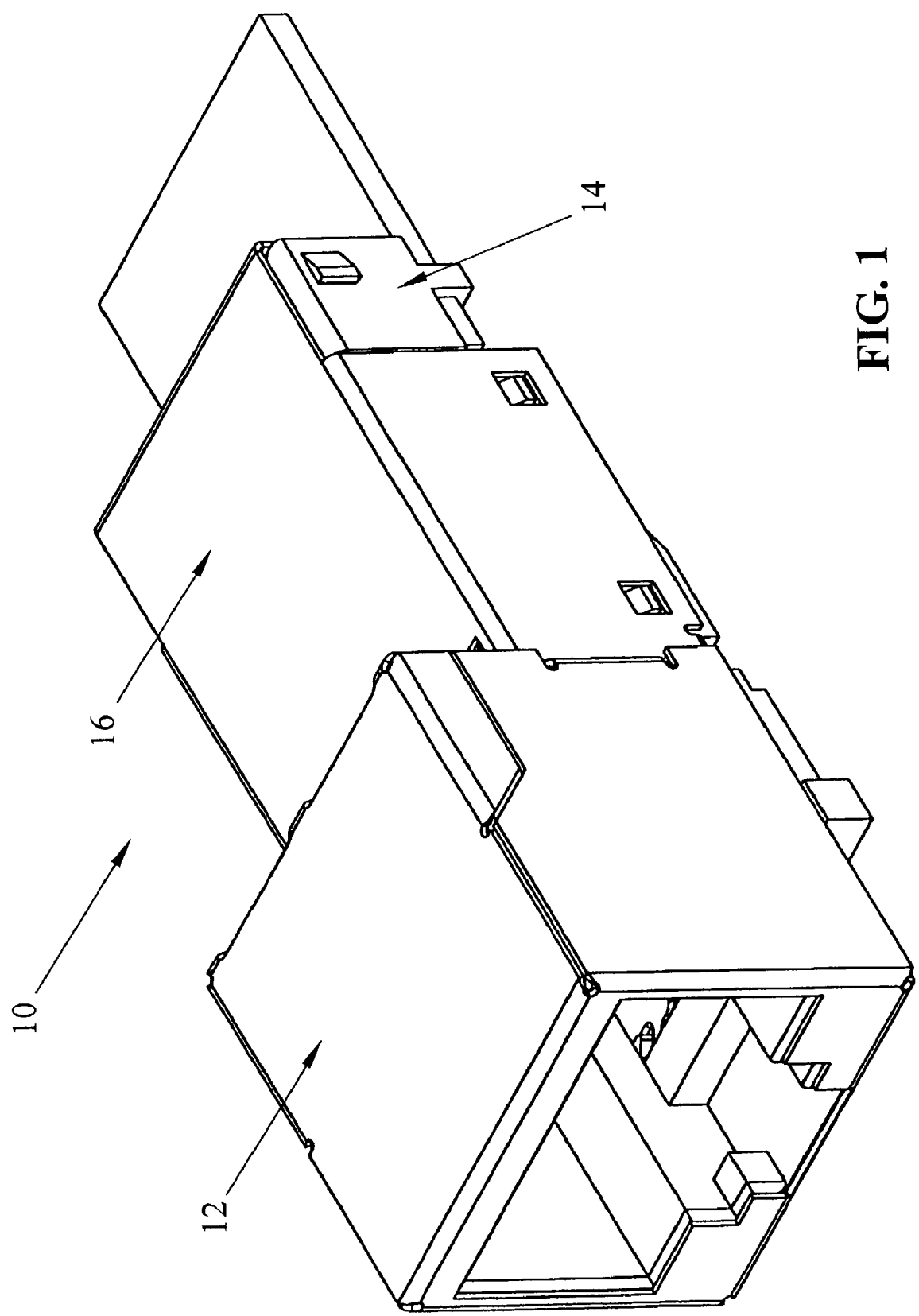
FIG. 1 is a perspective view of a pluggable modular jack for a gigabit Ethernet connection of the present invention.

Referring in detail to the drawings and with particular reference to FIG. 1, a pluggable modular jack with integrated gigabit magnetics is depicted. Pluggable modular jack 10 is partially comprised of front shield 12, magnetic housing subassembly 14, and rear shield 16.

Figure 2:
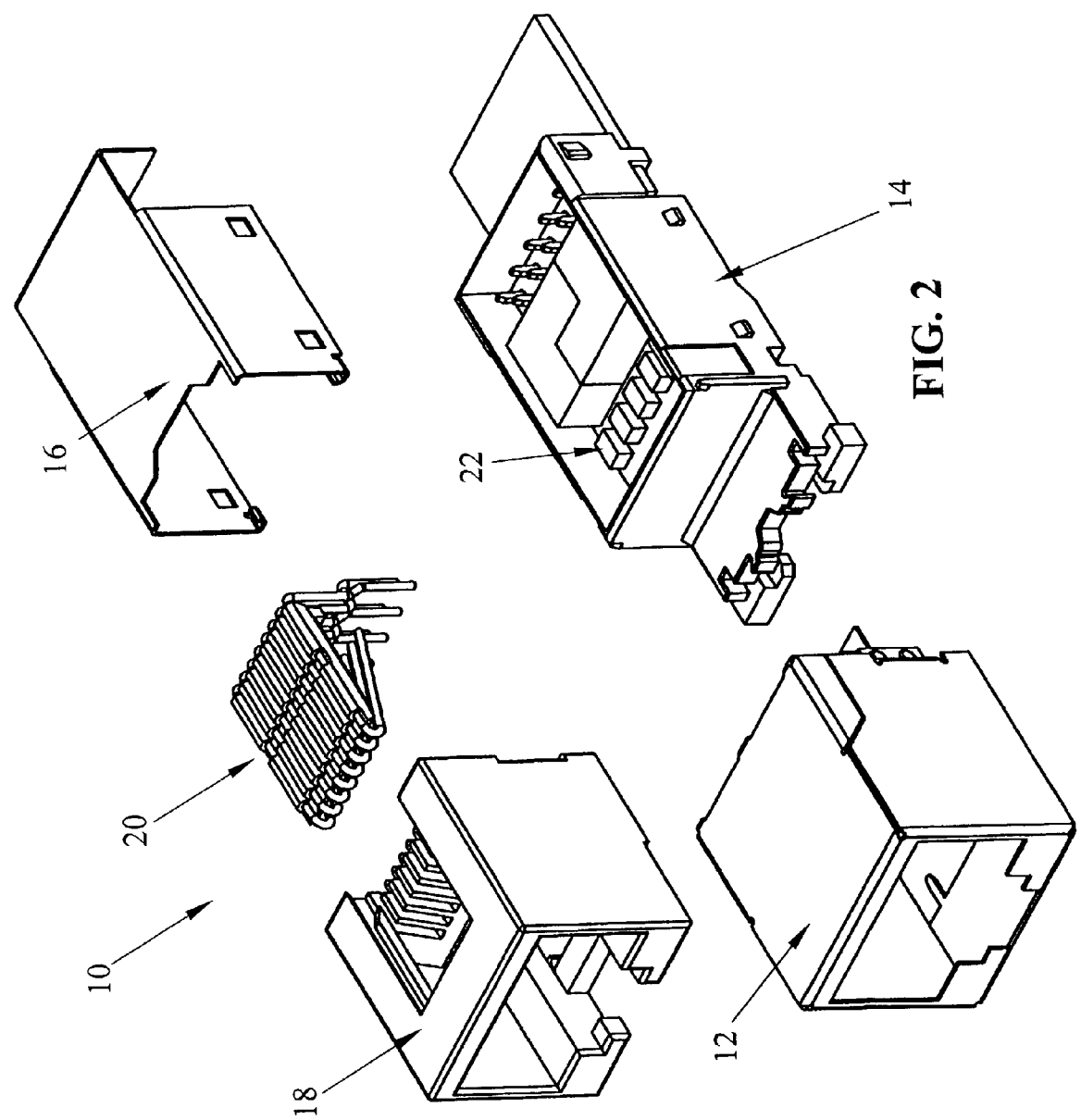
FIG. 2 is an exploded perspective view of the pluggable modular jack depicted in FIG. 1.

Referring now to FIG. 2, an exploded perspective view of pluggable modular jack 10 is shown. As can be seen in this figure, pluggable modular jack 10 further includes a housing 18, a terminal assembly 20, and printed circuit assembly 22, which is, in this view, shown retained within magnetic housing subassembly 14.

Figure 3:
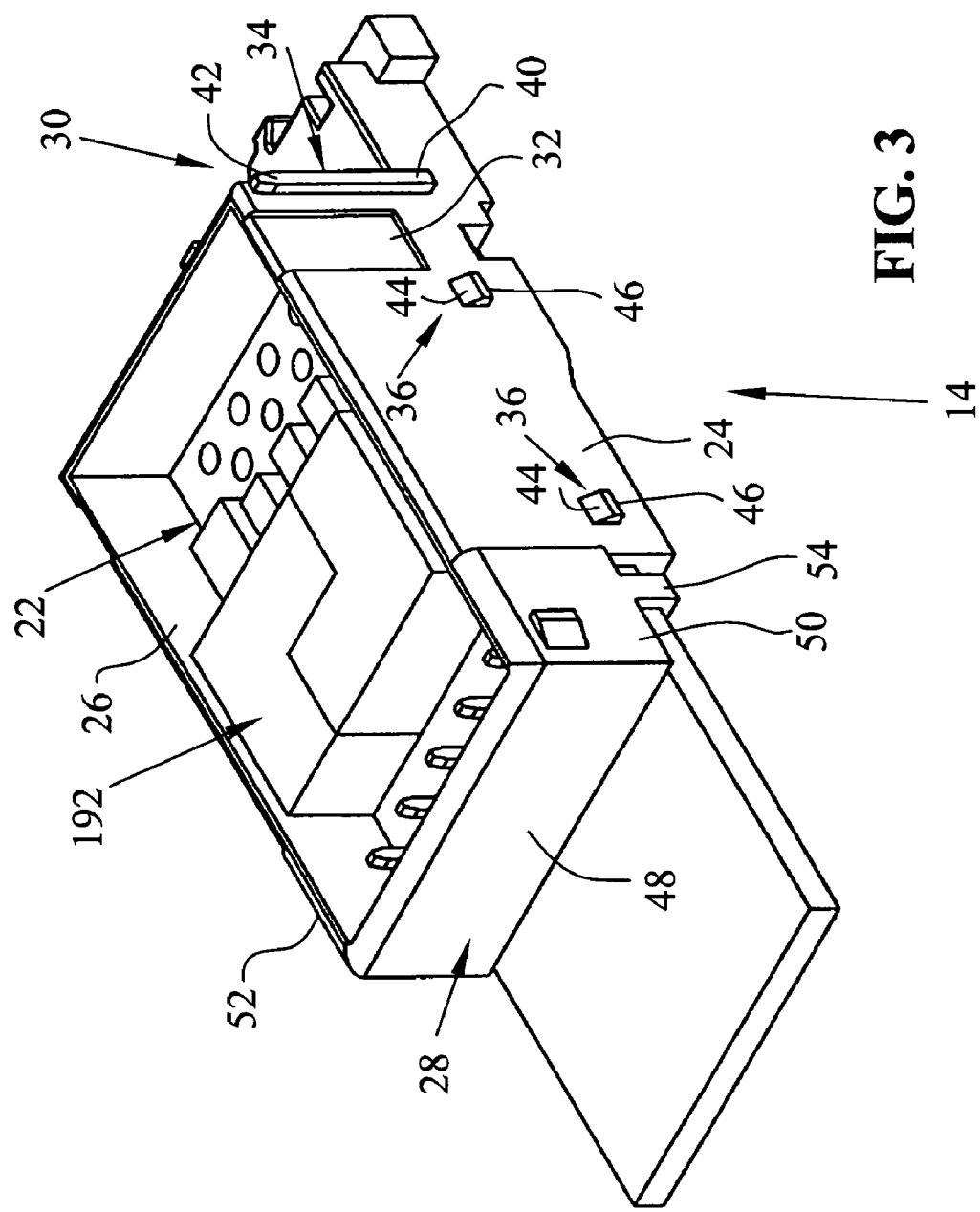
FIG. 3 is a rear perspective view of the magnetic housing subassembly utilized in the present invention for providing protection to the magnetic circuitry present in the current invention.
Figure 4:
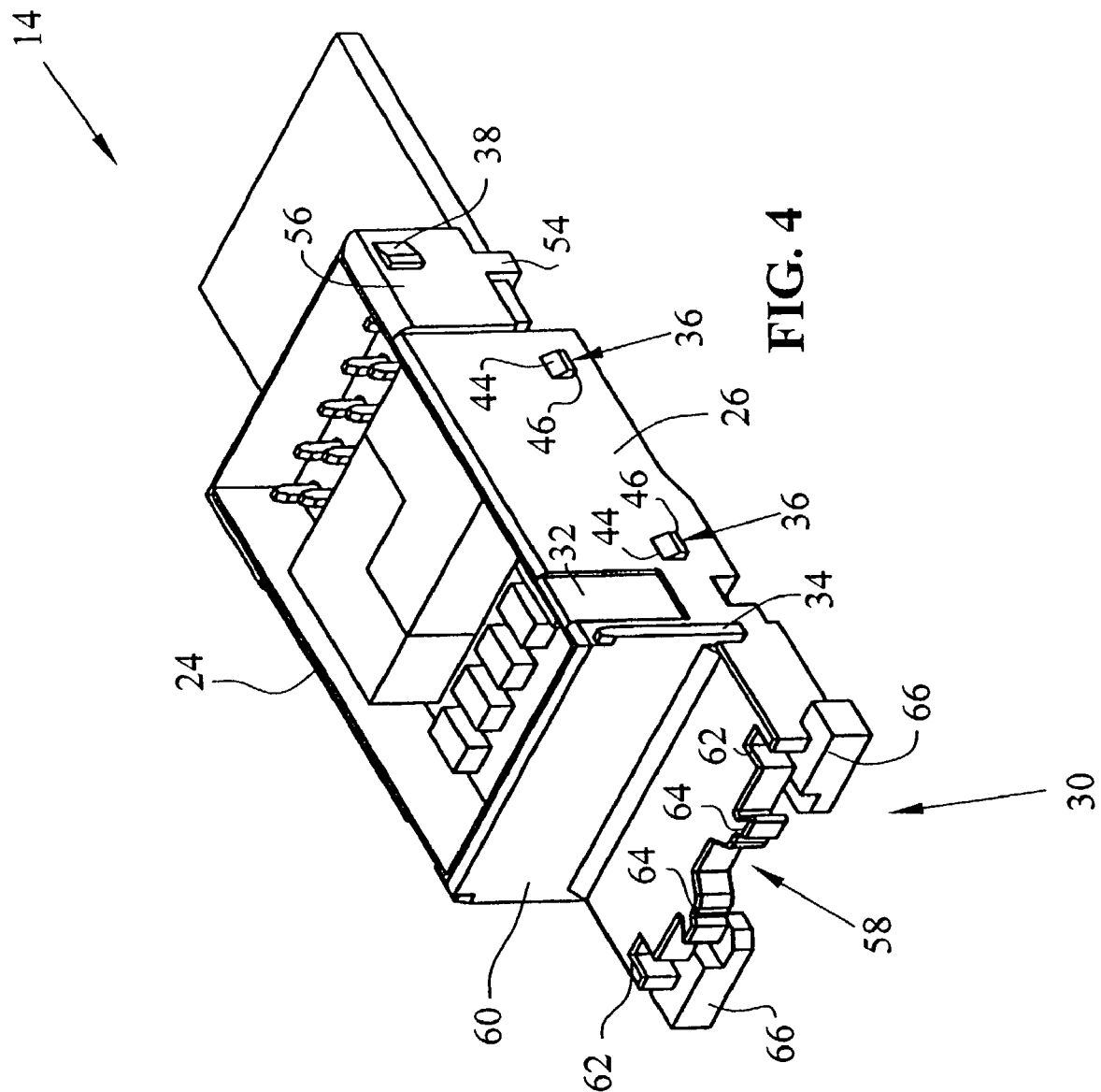
FIG. 4 is a front perspective view of the magnetic housing subassembly depicted in FIG. 3.

Referring now to FIGS. 3 and 4, magnetic housing subassembly 14 is depicted and will be described in greater detail. FIG. 3 depicts a rear perspective view of magnetic housing subassembly 14 whereas a front perspective view of the same is depicted in FIG. 4. Magnetic housing subassembly 14 is generally manufactured from plastic, or any other material known in the art displaying similar characteristics. Magnetic housing subassembly 14 includes a first side 24, a second side 26, a rear portion 28, a front portion 30, and a bottom (not shown).

First side 24, as seen best in FIG. 3, and second side 26, as seen best in FIG. 4, both include a recess 32, a locating rib 34, and a plurality of horizontal catches 36. It should be noted that first side 24 is a mirror image of second side 26 meaning that within magnetic housing subassembly 14, all components included within first side 24 are included within second side 26 opposite a longitudinal axis (not shown) extending through the center of magnetic housing subassembly 14. Locating rib 34 includes a body portion 40 having a substantially square cross section, and a lead-in portion 42 having a substantially pyramidal shape. In both first side 24 and second side 26, locating rib 34 is located forward of recess 32. Each of the horizontal catches 36 includes a sloped portion 44 and a flat latching surface 46. Horizontal catches 36 are orientated such that flat latching surface 46, which is a planar, rectangular shaped area, extends outward from the side to which it is attached and is facing downward in the direction toward the bottom (not shown) of the magnetic housing subassembly 14. Sloped portion 44 forms a ramp shape with a flat planar portion being located at an angle relative to the side which flat latching surface 46 is affixed.

Rear portion 28 is preferably molded from plastic and possesses a U-shape comprising a rear wall 48, a first side wall 50, and a second side wall 52. Rear wall 48 is substantially planar with a rectangular cross section. First side wall 50 and second side wall 52 both extend forwardly from rear wall 48 in a manner ensuring the side walls 50, 52 are parallel to each other, thereby forming the "U"-shape of rear portion 28. Each side wall 50, 52 has a locating tab 54 extending downward from the lower edge and parallel to each other. In addition, each side wall 50, 52 also includes a vertical catch 38, which possesses the same basic shape of horizontal catch 36. Vertical catch 38 differs from horizontal catch 36 in the respect that vertical catch 38 is rotated 90 degrees in relation to horizontal catch 36 such that flat portion 56 of vertical catch 38 faces forward whereas flat latching surface 46 of horizontal catch 36 faces downward.

Front portion 30 is best seen in FIG. 4, and includes alignment and locking means 58 and back 60. Back 60 is substantially planar and extends from the front edge of first side 24 to the front edge of second side 26, while orientated perpendicular to both. Alignment means 58 includes a plurality of notches 62, a plurality of tongues 64, and a plurality of stops 66. Notches 62 take a rectangular shape and extend into front portion 30 toward rear portion 28, however, notches 62 do not reach as far as back 60. Tongues 64, however, extend in the opposite direction, forwardly. In this embodiment, tongues 64 possess a dovetail shape directed forward and outward from the center of magnetic housing subassembly 14. Stops 66 are located below notches 62 and tongues 64 near the bottom (not shown) of magnetic housing subassembly 14.

Figure 5:
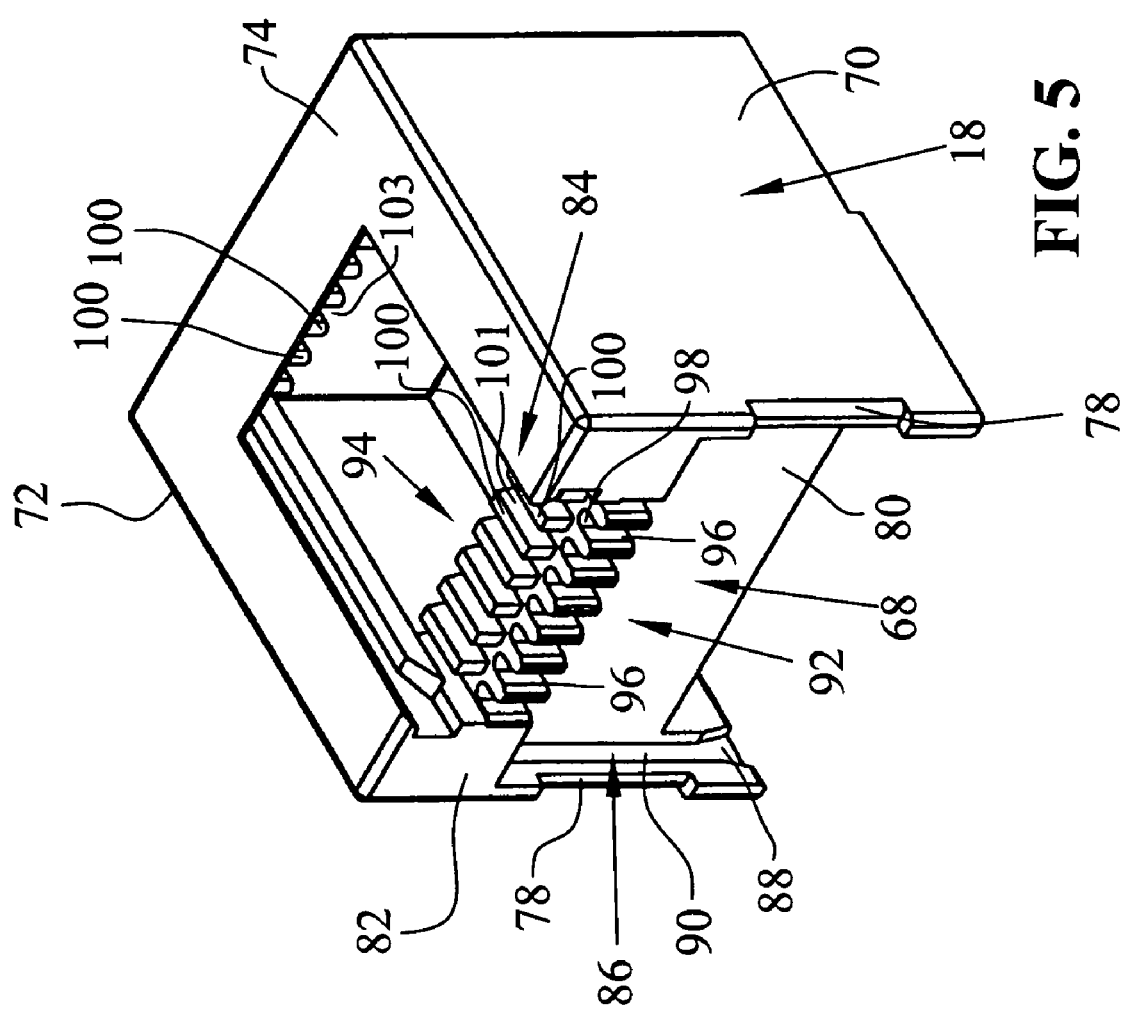
FIG. 5 is a perspective view of the housing utilized to connect the present invention to a typical Ethernet input connector.
Figure 6:
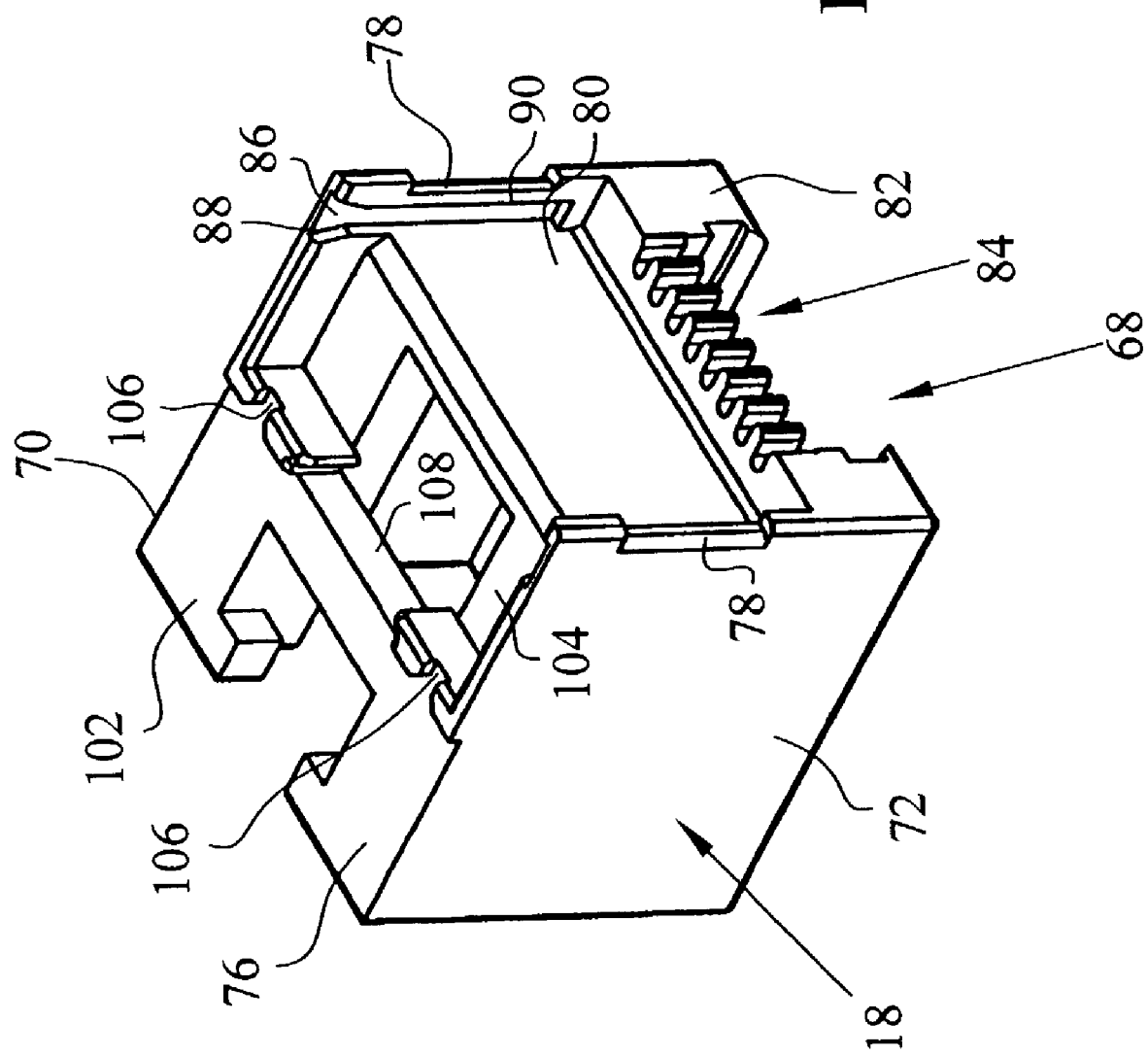
FIG. 6 is a perspective view of the underside of the housing depicted in FIG. 5.

Referring now to FIGS. 5 and 6, housing 18 is depicted in a perspective view from two different positions relative to the housing 18. Housing 18 is partially comprised of rear portion 68, first portion 70, second portion 72, top section 74, and bottom section 76. Housing 18 has a substantially cubic shape with first portion 70 located opposite second portion 72, top section 74 located opposite bottom section 76, and rear portion 68 located opposite the front portion (not shown), which is generally an opening or aperture of sufficient size to allow receipt of a standard Ethernet connector jack used in networking applications. Housing 18 is molded from a plastic or other insulated material. First portion 70 is substantially planar with three edges being straight and one edge located adjacent to rear portion 68 including a notch 78. Second portion 72 is similarly arranged having a planar profile with the edge adjacent to rear portion 68 also including a notch 78.

Rear portion 68 substantially extends perpendicularly between the edges of first portion 70 and second portion 72 that include notches 78. Rear portion 68 includes a substantially planar first section 80 and a second section 82 which includes a plurality of terminal locating means 84. First section 80 is offset from second section 82 such that first section 80 is not proximate the notches 78, whereas second section 82 is adjacent the edges. A pair of channels 86 are disposed between the notches 78 and first section 80. Each channel 86 includes an alignment section 88 and a straight section 90. Straight section 90 is arranged as a straight groove having a width, a length, and a depth sufficient to allow insertion of locating rib 34 therein. Alignment section 88 is similar to straight section 90 in that alignment section 88 has a width and a depth allowing receipt of locating rib 34 within. Alignment section 88 has walls, however, which are flared, in contrast to the parallel walls present in straight section 90. The flair present in the walls of alignment section 88 results in a larger opening than present in straight section 90.

Referring still to FIGS. 5 and 6, a plurality of terminal locating means 84 are centrally located within forward portion 82. Each of the terminal locating means 84 includes a retaining portion 92 and a horizontal alignment portion 94. Retaining portion 92 includes opening 96 and cavity 98. In a similar manner, each horizontal alignment portion 94 is comprised of a pair of raised walls 100 with a center 101. Center 101 and cavity 98 are aligned such that both are bisected by a plane extending parallel to first portion 70 and second portion 72. In addition, as best depicted in FIG. 5, secondary locating means 100 extends from the underside of top section 74. Secondary locating means 100 also includes a plurality raised walls 100 with a center 103 disposed between each adjacent wall 100. Each center 103 present in secondary locating means 100 is bisected by a corresponding plane which bisects center 101 and cavity 98 present within terminal locating means 84.

Referring now specifically to FIG. 6, bottom section 76 of housing 18 is shown. Bottom section 76 includes raised portion 102, lowered portion 104, and a pair of apertures 106. Raised portion 102 is flush with the adjacent edges of first portion 70 and second portion 72, whereas lower portion 104 is recessed below the edges creating an opening 108, which is profiled to receive therebetween, the dovetail tongues 64. Located adjacent lip 108 are a pair of apertures 106 which are used for alignment of the shield housing as will be described herein.

Figure 7:
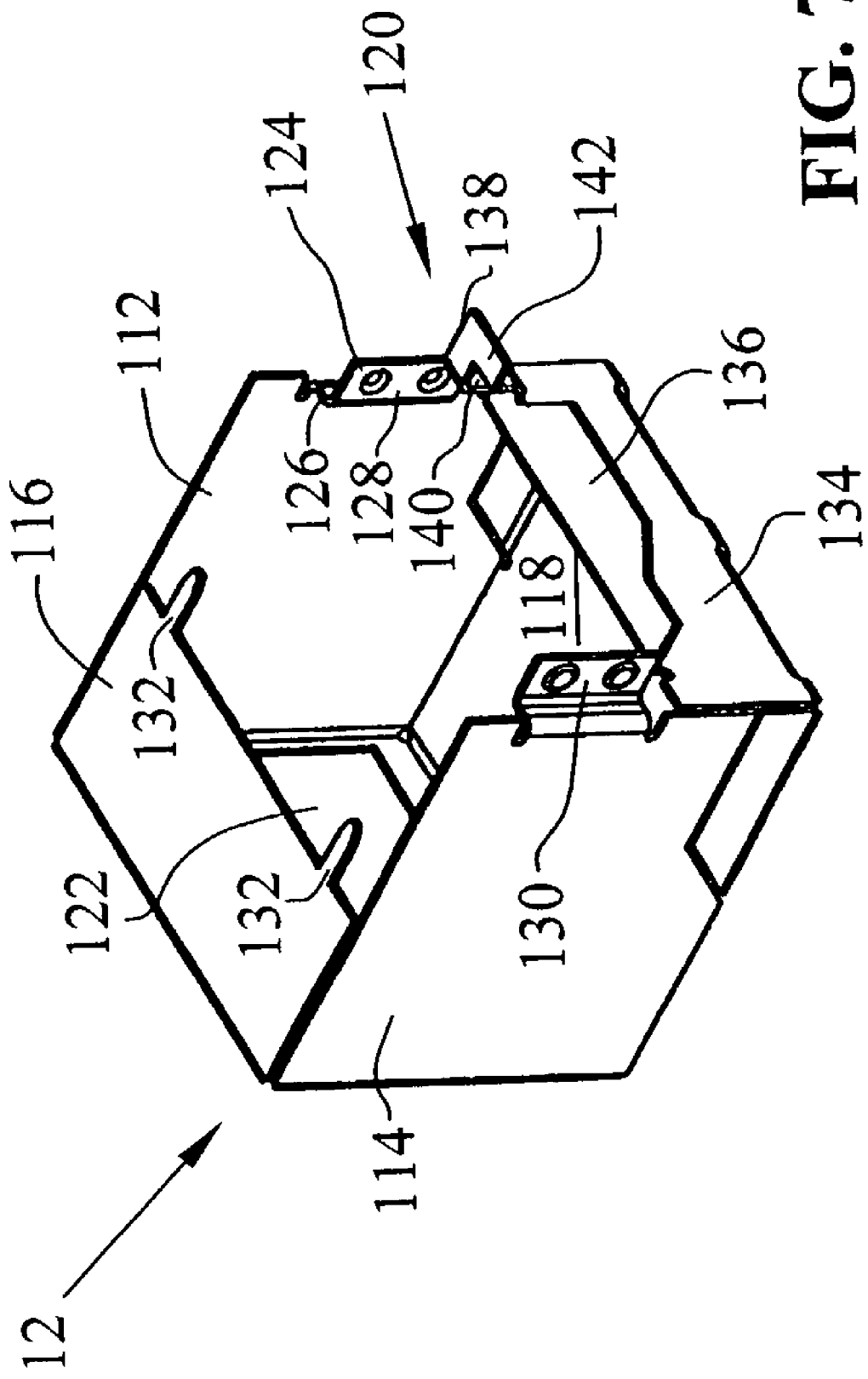
FIG. 7 is a perspective view of the underside of the front shield which fully encloses the housing shown in FIG. 5.

Referring now to FIG. 7, a perspective view of front shield 12 is shown. Front shield 12 is substantially cubic in shape and comprises first wall 112, second wall 114, bottom 116, top 118, rear section generally indicated by numeral 120, and front opening 122. First wall 112, second wall 114, and top 118 are substantially planar with smooth outer and inner surfaces. In addition, first wall 112 is located parallel to second wall 114. Grounding pad 124 comprises transverse portion 126 and planar portion 128 and is attached to first wall 112 along the edge proximate rear section 120. Transverse portion 126 extends inward and perpendicular from first wall 112 toward the center of rear section 120. Planar portion 128 forms a ninety degree angle with transverse portion 126 and is parallel to first wall 112. In addition, planar portion 128 is substantially planar having a size approximately equivalent to the size of recess 32 located on magnetic housing subassembly 14. Furthermore, the length of transverse portion 126 should be less than the length of notch 78 present within housing 18 so that transverse portion 126 may be located within notch 78. In a similar manner, second latch 130 is attached to second wall 114 and represents a mirror image of pad 124.

Bottom 116 extends between first wall 112 and second wall 114 and is attached to each at the lower edge. In addition, bottom 116 has a length approximately half the length of either first wall 112 or second wall 114, with a pair of locating members 132 extending straight toward rear section 120. Rear section 120 comprises body 134, tab 136, and shield tab 138. Body 134 extends between the leading edges of first wall 112 and second wall 114 from top 118 toward the pads 124, 130. Before body 134 contacts the pads 124, 130, however, insulator 136 perpendicularly extends therefrom in a direction away from front opening 122. Shield tab 138 extends from insulator 136 and comprises an extending leg 140 and contacting plane 142.

As stated above, front shield 12 also comprises top 118 and front opening 122. Front opening 122 is an aperture generally defined by edges of first wall 112, second wall 114, bottom 116, and top 118 and is located opposite rear section 120.

Figure 8:
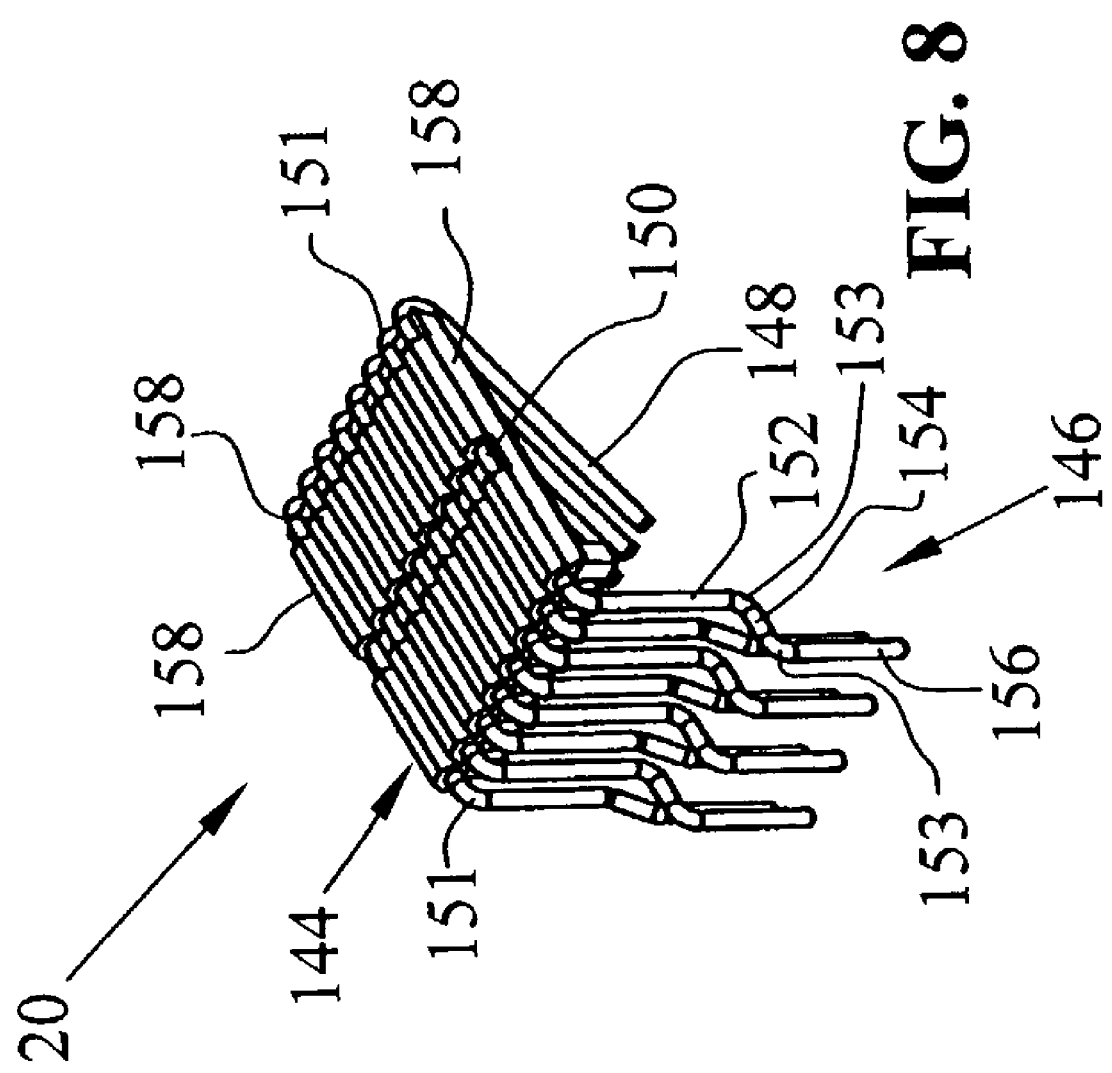
FIG. 8 is a perspective view of a terminal assembly utilized in the present invention.

Referring now to FIG. 8, terminal assembly 20 includes terminal housing 144 and a plurality of terminals 146. Terminal housing 144 includes a plurality of passages 158 each having substantially circular cross sections slightly larger than the cross section of terminals 146 so as to allow insertion of the terminals 146 therein. The passages 158 of terminal housing 144 are coupled to adjacent passages 158 along the longitudinal edge of each.

Each terminal 146 is comprised of angled portion 148, horizontal portion 150, first vertical leg 152, angled leg 154, and second vertical leg 156. Terminals 146 may be manufactured from any material which is conductive of electricity and slightly malleable for shaping. During the assembly of terminal assembly 20, a straight terminal (not shown) is overmolded by a web of material 158. The straight terminal (or wire) is then bent at two locations 151 with a portion of the straight terminal which is bent forming angled portion 148 and the bent portion forming first vertical leg 152. First vertical leg 152 is then bent at two locations 153 forming angled leg 154 and second vertical leg 156. Second vertical leg 156 extends parallel to first vertical leg 152 but is offset by the distance and direction of angled leg 154. Furthermore, the length and angle of the bends 153 between multiple terminals 146 may be varied giving the resulting second vertical legs 156 a staggered appearance.

Figure 9:
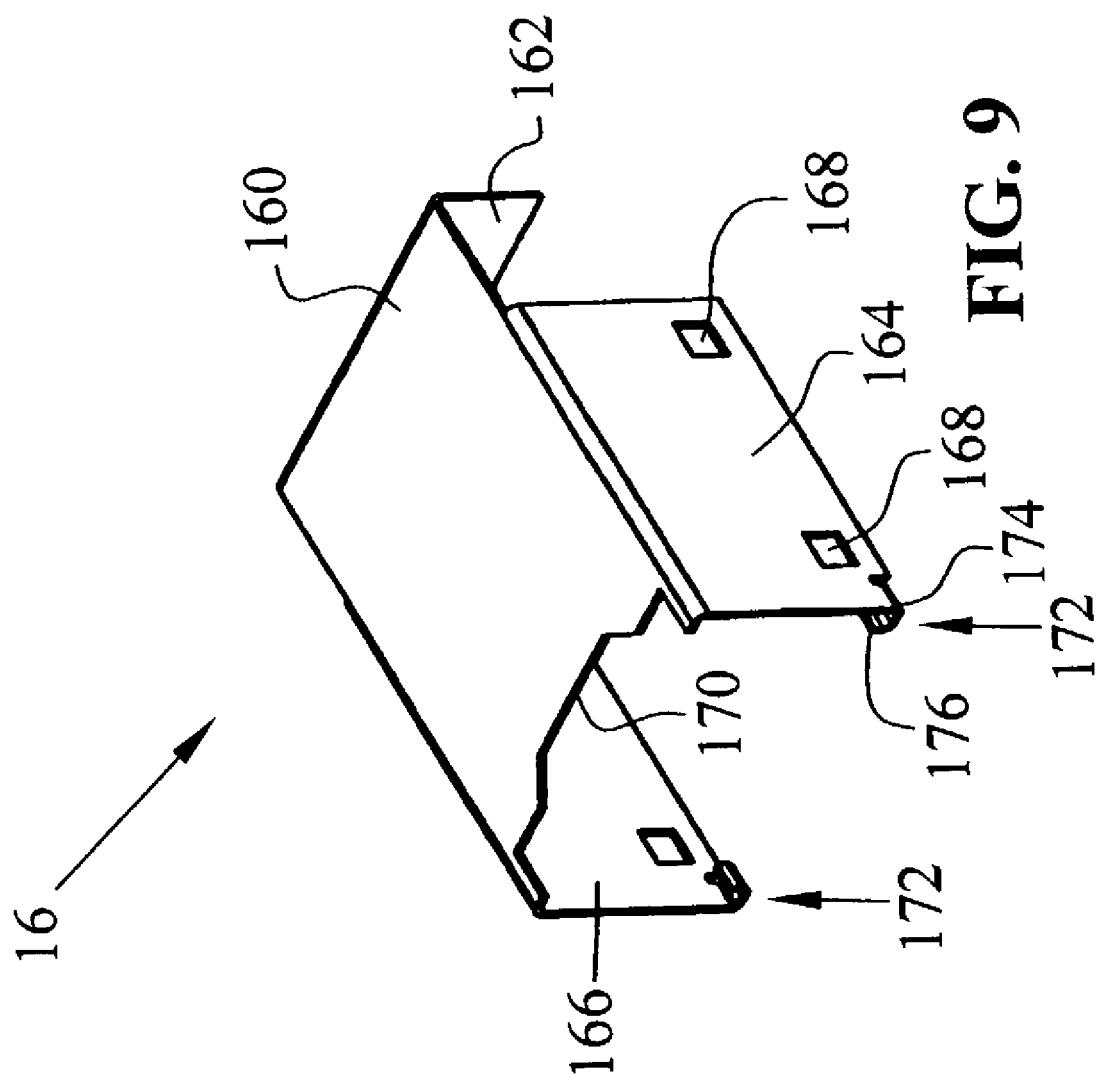
FIG. 9 is a perspective view of the rear shield which fully encloses the printed circuit board within the magnetic housing assembly.

Referring now to FIG. 9, a perspective view of rear shield 16 is depicted. Rear shield 16 includes top cover 160, rear cover 162, first wall 164, and second wall 166. First wall 164 has a substantially rectangular shape and includes a plurality of catch receivers 168. Catch receivers 168 are rectangular shaped apertures extending through first wall 164 and having sufficient size so as to allow insertion of the horizontal catches 36 of magnetic housing subassembly 14. First wall 164 also includes hooking tab 172. Hooking tab 172 comprises flat portion 174 and lip 176 and extends perpendicularly inward into rear shield 16 from first wall 164. In addition, second wall 166 maintains substantially the same structure as first wall 164 but is a mirror image thereof. This means flat portion 174 extends from second wall 166 inward into rear shield 16, but in an absolute direction opposite the direction of the extension of the flat portion 174.

Top cover 160 extends between the top edge of first wall 164 and the top edge of second wall 166 and is substantially planar. Top cover 160 includes three straight edges and complementary edge 170. Complementary edge 170 has a shape which complements the shape of tab 136 included within front shield 12 such that when complementary edge 170 is located adjacent insulator 136, a consistently smooth mating surface with no gaps is formed.

Figure 10:
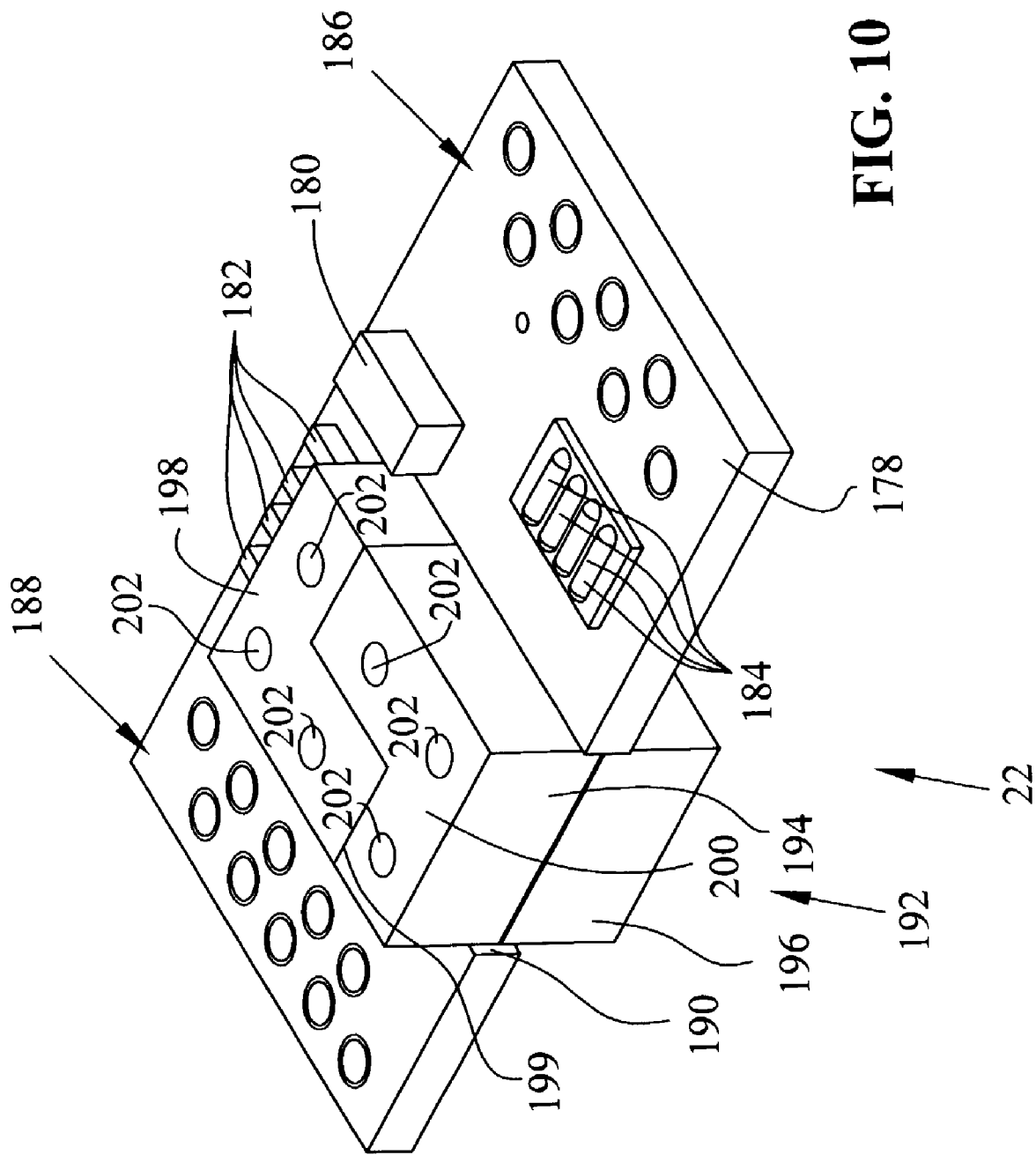
FIG. 10 is a perspective view of the printed circuit assembly utilized in the present invention.

Referring now to FIG. 10, a perspective view of a printed circuit assembly 22 is depicted. Printed circuit assembly 22 partially comprises circuit board 178, decoupling capacitor 180, a plurality of capacitors 182, and a plurality of resistors 184. Circuit board 178 includes a plurality of input contacts generally indicated by numeral 186, a plurality of output contacts generally indicated by numeral 188, and circuit board notch 190. Notch 190 represents an area of circuit board 178 which has been cut away so as to allow receipt of a coil pack generally indicated by numeral 192.

Coil pack 192 includes a first encapsulation pair 194 and a second encapsulation pair 196, with each encapsulation pair 194, 196 including six magnetic circuits, represented generally in this figure by way of round circles and indicated by numeral 202. Each encapsulation pair 194, 196 retains the magnetic circuits 202 in positions relative to one another, while also protecting the wires of the magnetic circuits 202 with a silicone encapsulation material. This provides, among other benefits, protection to the magnetic circuits 202 and the wires extending therefrom. In addition, the encapsulation material also strengthens the durability of the magnetic circuits 202, decreasing the risk of either a short circuit or an open circuit forming therein. Further, the encapsulation also provides a more robust means of retaining and transporting the magnetic circuits 202 as each magnet is held in a fixed position relative to the others following the encapsulation. As is well known, the choice of encapsulation material may vary from silicone, as long as the material chosen includes properties allowing the material perform the functions outlined above.

Figure 13:
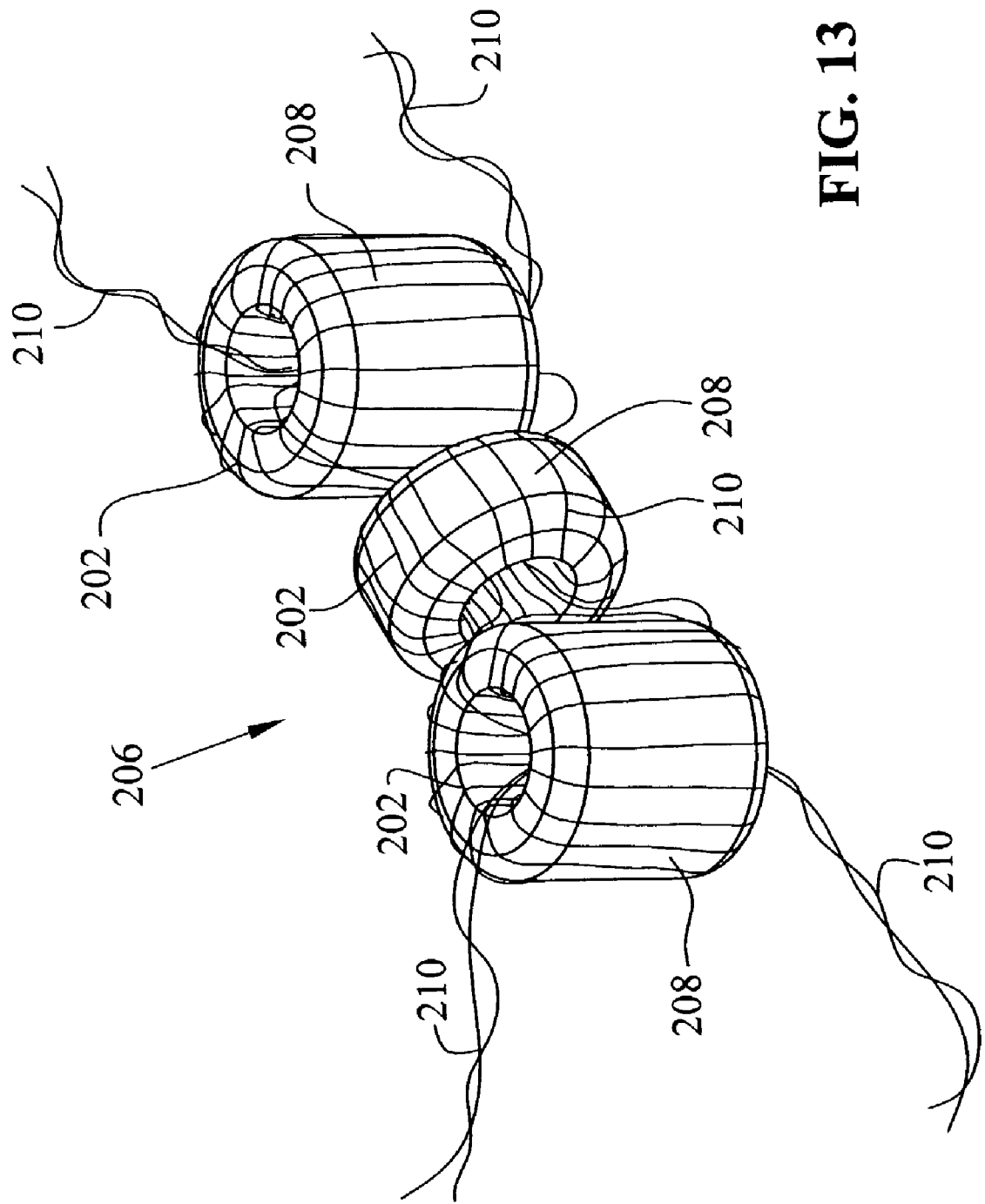
FIG. 13 is a twisted pair core set including three magnetic circuits utilized in the present invention.

Referring now to FIG. 13, a typical core set 206 is depicted in which three magnetic circuits 202 are arranged in series. Each magnetic circuit 202 includes a ferrous portion 208 and wire 210, with the wire 210 being wrapped around the ferrous portion 208 in any manner well known. The wrapping of the wire 210 forms a twisted pair around the ferrous portion 208 to facilitate the passage of electrical current around the ferrous portion 208 and create a magnetic flux. Prior to encapsulation, the wire 210 is also the only means linking the multiple ferrous portions 208 of a core set 206 together, such that if a ferrous portion 208 becomes unwound, or if the wire 210 is severed in any manner, the ferrous portion 208 is no longer connected to the core set 206 in any fashion.

Referring now to both FIGS. 10 and 13, a first core set 198 and a second core set 200 comprise a portion of first encapsulation pair 194. The core sets 198, 200 are differentiated by a marking line 199 utilized only in FIG. 10 as a means for distinguishing the core sets 198, 200. Further the structure of each core set 198, 200 prior to encapsulation, is depicted generally as core set 206 in FIG. 13.

Circuit board 178 further includes a circuit trace (not shown) present on the underside of the circuit board 178, as is commonly known in the art. The circuit trace provides a means of electrically connecting input contacts 186 with output contacts 188, as is well known, whereby electric signals may travel into the input contacts 186, through the circuit trace, and out of the output contacts 188. Decoupling capacitor 180, capacitors 182, and resistors 184 are affixed to circuit board 178 and connected to the circuit trace by any number of methods well known in the art. It should be noted that as the circuit trace is located on the underside of the circuit board 178, the above components must be incorporated into the circuit trace on the underside. Typically, this is accomplished by inserting the conductive portion of the component through the circuit board 178. The conductive portions are then soldered to the printed circuit connecting the component with the printed circuit. In reference to the core sets 198, 200 located proximate the upper face of circuit board 178, the inclusion of notch 190 allows the wires (not shown) encompassing the encapsulated magnetic circuits 202 to be easily soldered to the underside of the circuit board 178 without having to contact the edges of the circuit board 178 and be exposed. Rather, the wires may travel through notch 190 and remain present between first encapsulation pair 194 and second encapsulation pair 196 extending therefrom only to be soldered to the printed circuit.

Figure 11A:
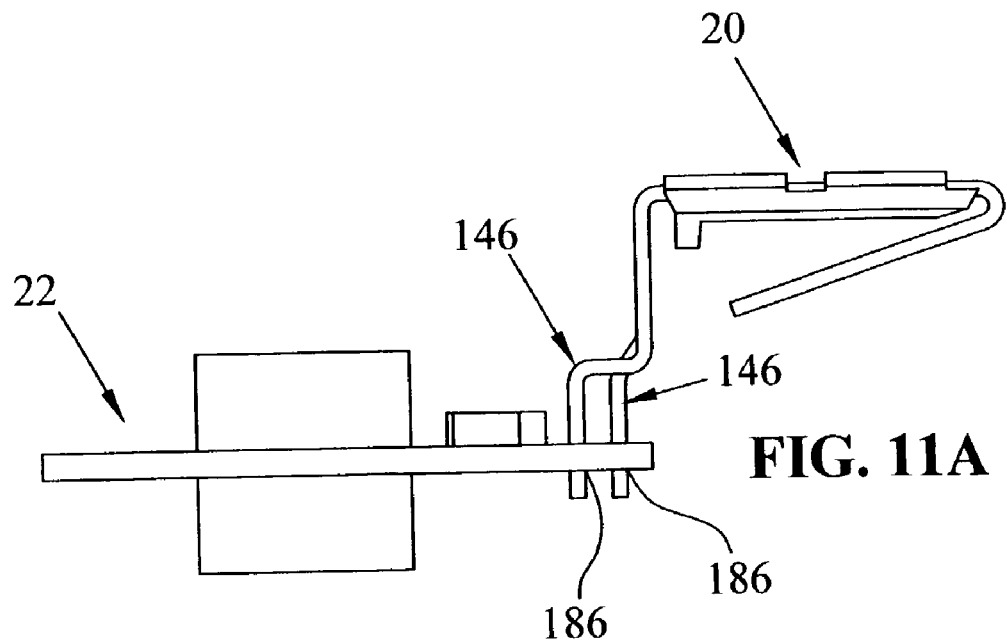
FIGS. 11A through 11D are progressive views of the pluggable modular jack being assembled in progressive sequence.

Referring now to FIGS. 11A through 11E, assembly of an Ethernet connector is depicted and will be described. The first step of the assembly includes soldering decoupling capacitor 180, capacitors 182, resistors 184, and magnetic circuits 202 to circuit board 178 in order to form printed circuit assembly 22. Next, terminal assembly 20 is coupled to printed circuit assembly 22 with the individual terminals 146 being inserted into input contacts 186 and then soldered thereto, as depicted in FIG. 11A. As should be apparent to one possessing ordinary skill in the art, terminals 146 may be coupled to input contacts 186 by way of a variety of methods capable of creating electrical contact between the two components. Further, terminals 146 may be required to be bent at different angles, as described above, in order to ensure proper location of the terminals 146 within input contacts 186, as input contacts 186 are staggered in printed circuit assembly 22, as depicted in FIG. 10.

Figure 11B:
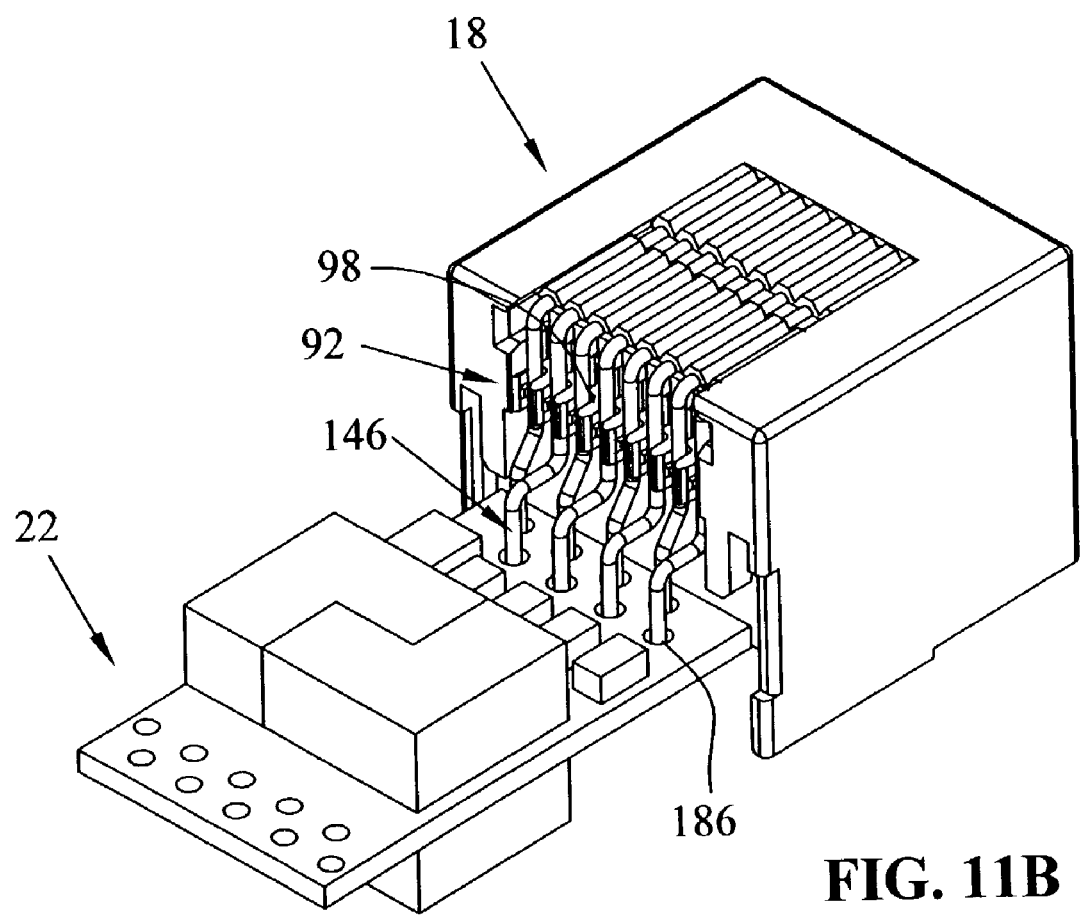

Referring now to FIG. 11B, terminal assembly 20, and specifically terminal housing 144, may be slid into housing 18 so that first vertical leg 152 of each terminal 146 comes to rest within a cavity 98 present in terminal locating means 84. Further, horizontal portion 150 of each terminal should also be retained by secondary locating means 110.

Figure 11C:
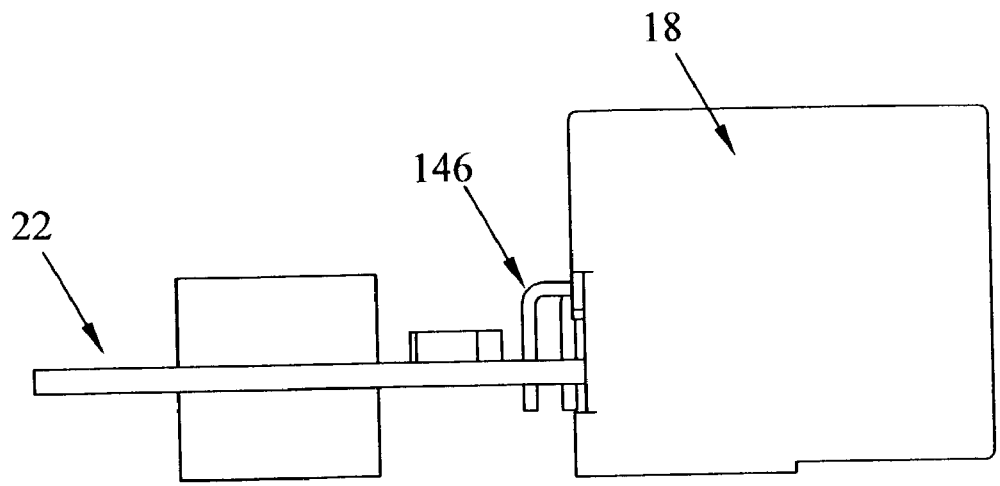
Figure 11C:
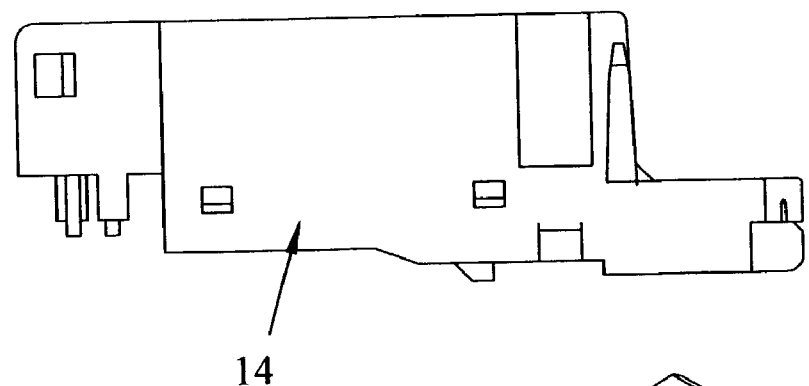

Referring now to FIG. 11C, the next step of assembly requires magnetic housing subassembly 14 to be coupled to housing 18. Magnetic housing subassembly 14 engages housing 18 and printed circuit assembly 22 from below such that tongues 64 slide into contact with the corresponding grooves 106 present within housing 18. Further, locating rib 34 present on opposing sides of magnetic housing subassembly are inserted into channels 86 located within housing 18. The insertion of locating rib 34 into channels 86 is facilitated by alignment section 88 which functions as a guide ensuring each locating rib 34 is traveling substantially through the center of a corresponding channel 86.

Figure 11D:
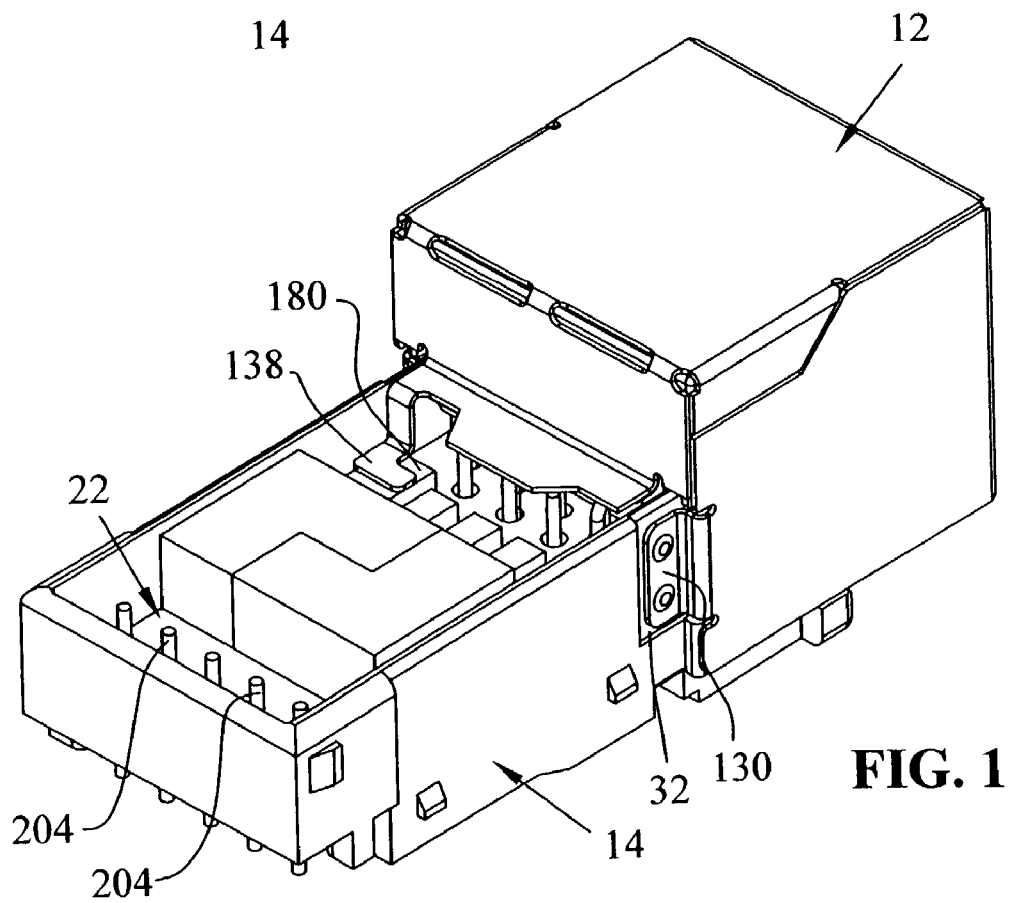

Referring now to FIG. 11D, front shield 12 is added to the assembly in such a manner so that grounding pads 124, 130 are located within recesses 32, providing a primary means of coupling rear shield 16 to magnetic housing subassembly 14. Further, shield tab 138 contacts decoupling capacitor 180 and is soldered thereto. In addition, soldertail contacts 204 may be inserted into output contacts 188 and soldered thereto in order to facilitate and maintain an electrical connection. As should be apparent to one skilled in the art, soldertail contacts 204 may be affixed to output contacts 188 by way of a variety of different methods.

Figure 14:
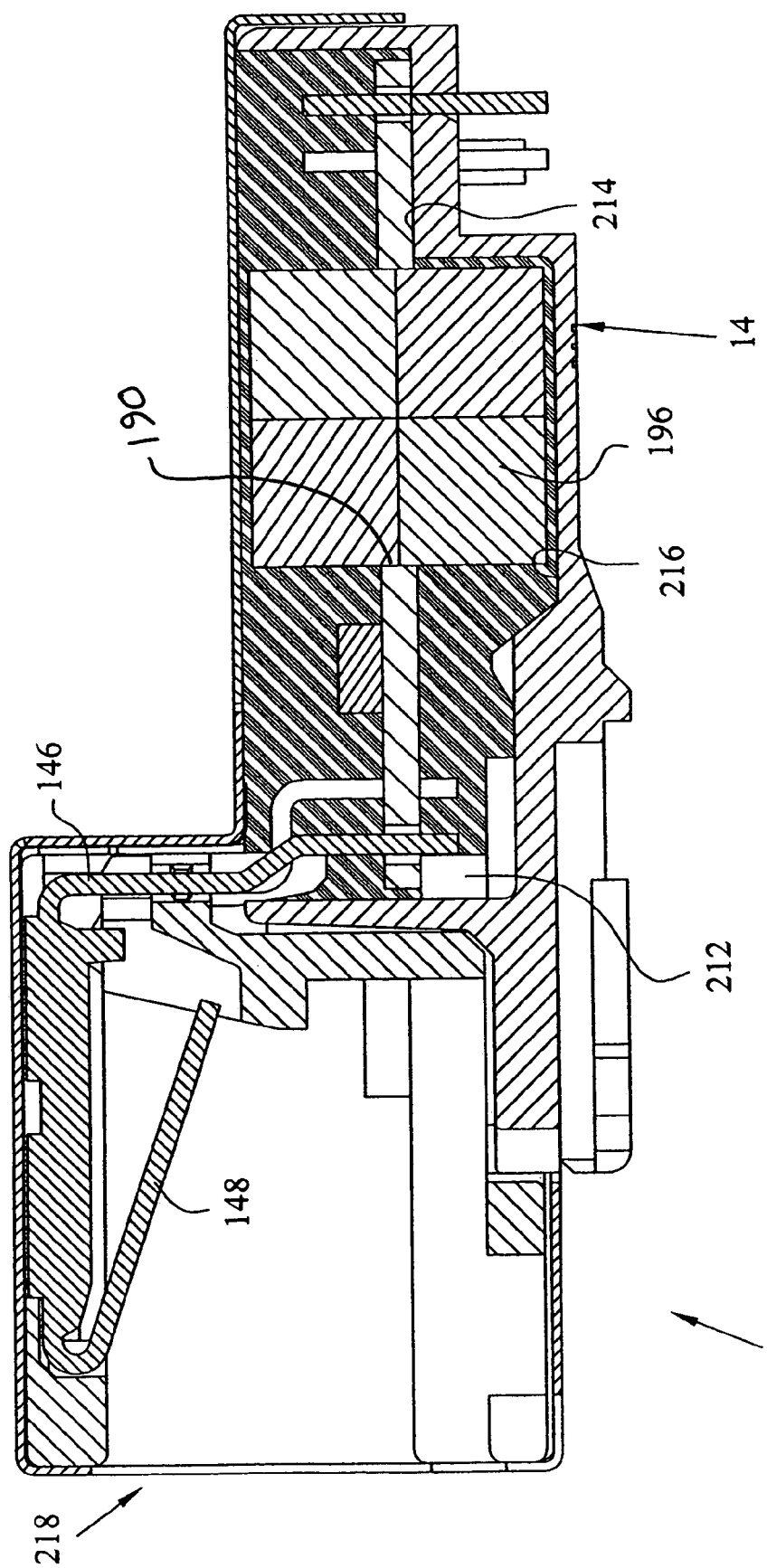
FIG. 14 is a sectional view of the pluggable modular jack depicted in FIG. 1.

In the final step of assembly, rear shield 16 is added to the pluggable modular jack assembly 10. Prior to the addition of rear shield 16 to the assembly 10, however, the magnetics and circuitry of printed circuit assembly 22 may be encapsulated with any well known encapsulation material, such as a potting material 220, as shown in FIG. 14. Following this encapsulation, rear shield 16 may be snapped into position on assembly 10 from above. When properly assembled, horizontal catches 36 of magnetic housing subassembly 14 should each be located within a catch receiver 168 of rear shield 16, as depicted in FIG. 1. Sloped portion 44 facilitates the positioning of horizontal catches 36 within catch receiver 168 as rear shield 16 is lowered onto the assembly 10. As first wall 164 and second wall 166 come into contact with sloped portion 44, sloped portion 44 functions as a ramp causing first wall 164 and second wall 166 to spread. However, once catch receivers 168 clear flat latching surface 46 of horizontal catches 36, first wall 164 and second wall 166 retract into their normal positions locking rear shield 16 in place over magnetic housing subassembly 14 with horizontal catches 36 positioned within catch receivers 168.

Referring now to FIG. 14, a sectional view of pluggable modular jack 10 is depicted. In this view, it can be seen that magnetic housing subassembly 14 includes a first land 212, a second land 214, and a well 216 disposed between. The lands 212, 214 provide a means of supporting printed circuit 178 within magnetic housing subassembly 14. Well 216, however, is required to achieve this end as second encapsulation pair 196 extends below the surface of printed circuit 178.

Referring still to FIG. 14, it should be apparent to one possessing ordinary skill in the art, that angled portions 148 of terminals 146 provide a means of electrically coupling the pluggable modular jack 10 with a standard Ethernet plug (not shown) inserted into the front opening 218 of housing 18.

Figure 12:
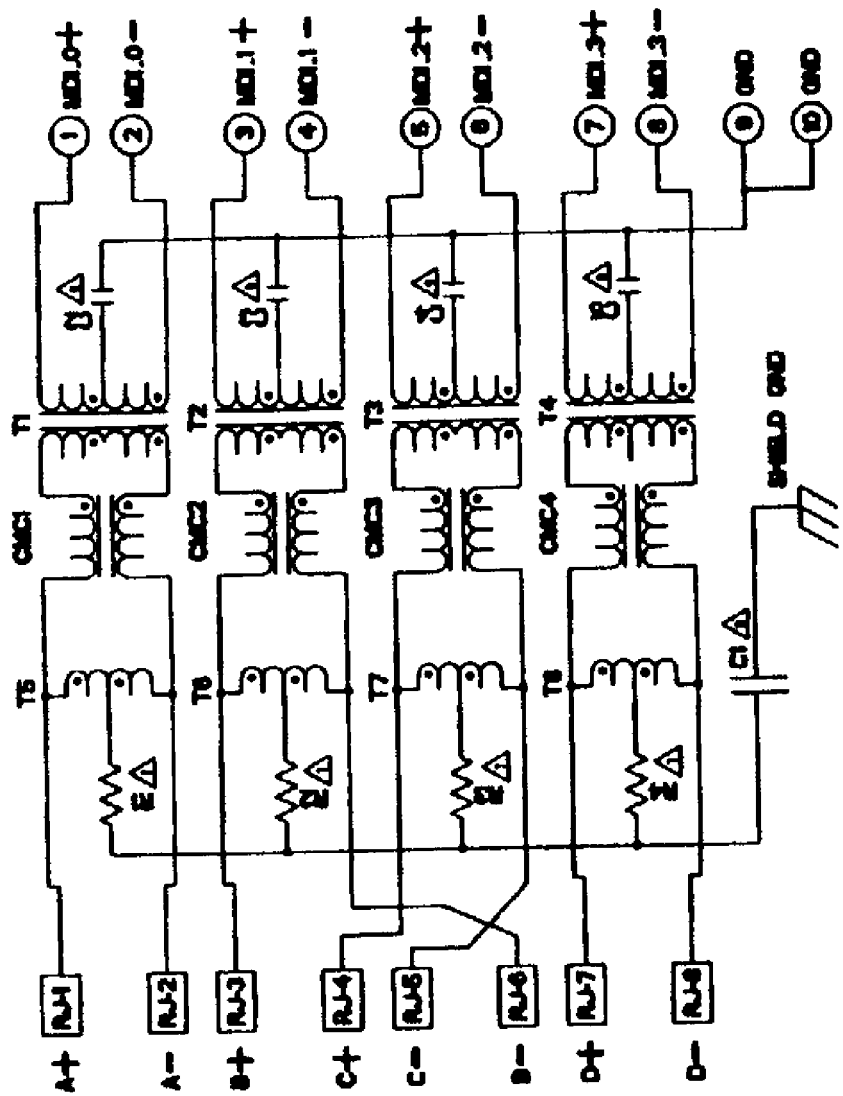
FIG. 12 is a circuit diagram exemplary of the type which may be utilized in the present invention.

Referring now to FIG. 12, a circuit diagram consistent with the type that may be used in the present invention is depicted. Input contacts 186 present within circuit board 178 are represented in this diagram by inputs labeled RJ-1 through RJ-8. In a similar manner, output contacts 188 are shown on the right side of the circuit diagram as MDI.0 through MDI.3 and GND 9 and GND 10. The resistors 184 soldered to the printed circuit assembly 22 are represented as R1 through R4. The decoupling capacitor 180 is shown as C1, whereas the other capacitors 182 are depicted as C2 through C5. As can be seen in the circuit diagram, each of the channels connecting an input 186 to an output 188 includes three magnetic circuits 202 which are coupled in series. The first magnet circuit in each channel, designated as T5 through T8, respectively, functions as a low impedance, common mode termination to ground. The second magnetic circuit in each series, labeled CMC1 through CMC4, respectively, functions as a common mode choke in the circuit. In addition, the third magnetic circuit in each series, designated as T1 through T4, functions as an isolation transformer that provides an output voltage equal to the input voltage, through impedance which cleans up the voltage signal.

Referring now to FIGS. 12 and 14, in operation, an Ethernet plug (not shown) is interested into pluggable modular jack 10 through opening 218. The eight output nodes of the Ethernet plug should each engage angled portions 148 of the eight terminals 146. As this is a common mode circuit, angled portions 148 receive any output signal generated by the Ethernet plug and transfer the signal through a pair of terminals 146 to two inputs 186 of the printed circuit assembly 22. As stated above, the eight inputs 186 correspond to the eight inputs of the circuit diagram depicted in FIG. 12. The signal received by the printed circuit travels through the first magnetic circuit in series with the corresponding twisted pair input. This first coil functions as a low impedance, common mode termination to ground allowing a portion of the common signal to be recycled through the shield ground and reducing stray current. The signal passes through the common mode choke, which functions as a 1:1 ratio transformer, and balances the current through the twisted pair of the channel. The signal then travels to the third magnet circuit in the series which functions as an isolation transformer, which generates an output voltage substantially equal to the input voltage while also cleaning up the signal. The signal finally travels down the printed circuit to the outputs to which soldertail contacts 204 are coupled and transfers to the mating circuit board. As would be apparent to one with ordinary skill in the art, the signal path and transfer depends upon the capacity of the resistors and capacitors in each signal channel. The overall effect of this circuit is to provide a high speed connector of low profile.

While this invention has been described as having an exemplary design, the present invention may be further modified within the spirit and scope of this disclosure. The application is, therefore, intended to cover any variations, uses, or adaptations of the invention using its general principles. Further, this application is intended to cover such departures from the present disclosure as come within known or customary practice in the art to which this invention pertains.

What we claim is:

1. A pluggable Ethernet connector jack having a magnetically coupled gigabit circuit board comprising:
   a magnetic housing including a first attachment mechanism;
   a jack housing having a second attachment mechanism co-operable with said first attachment mechanism and a terminal retaining mechanism;
   a terminal assembly including a plurality of terminals and a terminal housing partially located within said jack housing; and
   a printed circuit assembly comprising a printed circuit board having a plurality of circuit traces present on the underside of said printed circuit board, defining input connections and output connections, a plurality of electrical components electrically coupled to select ones of said circuit traces, a notch through said printed circuit board, and a plurality of magnetic coils;
   wherein a portion of said terminals are electronically coupled to said input connections, said magnetic housing and said jack housing are coupled through interaction of said first and second attachment mechanisms, and said magnetic coils are encapsulated in an encapsulation material and electronically coupled to select ones of said circuit traces and at least partially positioned within said notch.

2. The pluggable Ethernet connector jack having a magnetically coupled gigabit circuit board as set forth in claim 1 wherein said magnetic coils are encapsulated as a first encapsulation pair and a second encapsulation pair.

3. The pluggable Ethernet connector jack having a magnetically coupled gigabit circuit board as set forth in claim 2 wherein said first encapsulation pair is positioned proximate to a first side of said printed circuit board and said second encapsulation pair is positioned proximate a second side of said printed circuit board.

4. The pluggable Ethernet connector jack having a magnetically coupled gigabit circuit board as set forth in claim 3 wherein said first encapsulation pair and said second encapsulation pair are both comprised of a plurality of core sets.

5. The pluggable Ethernet connector jack having a magnetically coupled gigabit circuit board as set forth in claim 4 wherein each core set includes a set of three magnetic circuits.

6. The pluggable Ethernet connector jack having a magnetically coupled gigabit circuit board as set forth in claim 5 wherein said magnetic circuits in each core set are coupled together in series.

7. The pluggable Ethernet connector jack having a magnetically coupled gigabit circuit board as set forth in claim 6 wherein said encapsulation material is silicone.

8. The pluggable Ethernet connector jack having a magnetically coupled gigabit circuit board as set forth in claim 7 wherein said plurality of electrical components comprise a plurality of resistors, a plurality of capacitors, a decoupling capacitor or any combination thereof.

9. A pluggable Ethernet connector jack comprising:
   a jack housing including a terminal assembly comprising a plurality of terminals; and
   a magnetic subassembly coupled to said jack housing, said magnetic subassembly including a magnetic housing and a printed circuit assembly comprising a printed circuit board with a plurality of circuit traces and a plurality of electrical components including a coil pack, wherein said coil pack includes a first set of encapsulated electrical components positioned substantially on a first side of said printed circuit board and a second set of encapsulated electrical components positioned substantially on a second side of said printed circuit board, said printed circuit board comprising a notched cut away portion, wherein a portion of said coil pack is positioned within said notched cut away portion.

10. The pluggable Ethernet connector jack as set forth in claim 9, wherein each of said set of encapsulated electrical components includes six magnetic circuits.

11. The pluggable Ethernet connector jack as set forth in claim 10, wherein three of said six magnetic circuits forms a first group and the remaining three of said six magnetic circuits forms a second group, said magnetic circuits of said first group is arranged in series and said magnetic circuits of said second group is arranged in series.

12. The pluggable Ethernet connector jack as set forth in claim 10, wherein each said magnetic circuit includes a ferrous portion and a wire wrapped around said ferrous portion.

13. The pluggable Ethernet connector jack as set forth in claim 9, wherein said first and said second core set each include silicon as an encapsulate.

14. The pluggable Ethernet connector jack as set forth in claim 9, wherein said printed circuit board further compris-ing a plurality of electrical components distinct from any of said first and second set of encapsulate components.

15. The pluggable Ethernet connector jack as set forth in claim 14, wherein said further plurality of electrical components include a plurality of resistors.

* * * * *